United States Patent [19]
Cutter et al.

[11] Patent Number: 5,631,862
[45] Date of Patent: May 20, 1997

[54] SELF CURRENT LIMITING ANTIFUSE CIRCUIT

[75] Inventors: Douglas J. Cutter; Kurt D. Beigel, both of Boise, Id.; Adrian E. Ong, Santa Clara, Calif.; Fan Ho, Boise, Id.; Patrick J. Mullarkey, Meridian, Id.; Dien S. Luong, Boise, Id.; Brett Debenham; Kim M. Pierce, both of Meridian, Id.

[73] Assignee: Micron Technology, Inc., Boise, Id.

[21] Appl. No.: 611,419

[22] Filed: Mar. 5, 1996

[51] Int. Cl.⁶ .................................................. G11C 17/16
[52] U.S. Cl. .................... 365/96; 365/225.7; 365/189.05
[58] Field of Search ................................ 365/225.7, 200, 365/189.05, 96, 230.06

[56]        References Cited
U.S. PATENT DOCUMENTS

5,442,589  8/1995  Kowalski ..................... 365/225.7
5,448,187  9/1995  Kowalski ..................... 365/225.7
5,526,312  6/1996  Eltoukhy ..................... 365/225.7

*Primary Examiner*—Tan T. Nguyen
*Attorney, Agent, or Firm*—Seed and Berry LLP

[57]        ABSTRACT

An antifuse bank includes a bank of self-decoupling antifuse circuits. The antifuse circuits are programmed according to a pattern of address bits by blowing antifuses corresponding to bits of the address. The antifuses are blown by applying a high voltage across the antifuse. As each antifuse is blown, its resistance drops and current through the antifuse increases. The self-decoupling circuit detects the increased current flow and, when the antifuse resistance is sufficiently low, limits current flow through the antifuse. The antifuse thus does not load the high voltage source as other antifuses are blown.

18 Claims, 6 Drawing Sheets

SELF CURRENT LIMITING ANTIFUSE CIRCUIT

TECHNICAL FIELD

The present invention relates to antifuse circuits in integrated circuit devices.

BACKGROUND OF THE INVENTION

Typical integrated memory circuits include arrays of memory cells arranged in rows and columns. In many such integrated memory arrays, several redundant rows and columns are provided to be used as substitutes for defective locations in memory. When a defective bit location is identified, rather than treating the entire array as defective, a redundant row or column is substituted for the defective row or column. This substitution is performed by assigning the address of the defective row or column to the redundant row or column such that, when an address signal corresponding to the defective row or column is received, the redundant row or column is addressed instead.

To make substitution of the redundant row or column substantially transparent to a system employing the memory circuit, the memory circuit includes an address detection circuit. The address detection circuit monitors the row and column addresses and, when the address of a defective row or column is received, enables the redundant row or column instead.

One type of address detection circuit is a fuse-bank address detection circuit. Fuse-bank address detection circuits employ a bank of sense lines where each sense line corresponds to a bit of an address. The sense lines are programmed by blowing fuses in the sense lines in a pattern corresponding to the address of the defective row or column. Addresses are then detected by first applying a test voltage across the bank of sense lines. Then, bits of the address are applied to the sense lines. If the pattern of blown fuses corresponds exactly to the pattern of address bits, the sense lines all block current and the voltage across the bank remains high. Otherwise, at least one sense line conducts and the voltage falls. A high voltage thus indicates the programmed address has been detected. A low voltage indicates a different address has been applied.

Typically, the fuses are blown by laser cutting the fuse conductors to remove the conductive paths through the fuses. One problem with such an approach is that laser cutting of the fuses is time consuming, difficult, and imprecise. Using antifuse repair also allows repair of packaged parts. As a consequence, the cost and reliability of memory devices employing fuse bank circuits can be less than satisfactory.

To eliminate the cost, difficulty, and expense of laser cutting, memory devices have recently been developed that employ antifuses in place of conventional fuses. Antifuses are capacitive-type structures that, in their unblown states, form open circuits. Antifuses may be "blown" by applying a high voltage across the antifuse. The high voltage causes the capacitive-type structure to break down, forming a conductive path through the antifuse. Therefore, blown antifuses conduct and unblown antifuses do not conduct.

Typically, the high voltage for blowing antifuses comes from a single voltage source applied to several antifuses simultaneously so that the antifuses can be blown in groups. Due to variations among the individual antifuses, the response to the high voltage may vary significantly across a particular group. For example, some of the antifuses may blow quickly while other, more robust, antifuses may take significantly longer to blow.

As the less robust fuses blow, they begin to draw current from the high voltage source. The cumulative current draw of the less robust fuses can be sufficient to significantly load the high voltage source. Consequently, the output voltage of the high voltage source may drop before the more robust fuses are blown. In some cases, the voltage can drop to a low enough level that the more robust antifuses remain unblown or are only partially blown. As a consequence, the pattern of blown antifuses will not correspond to the appropriate address, and the address detection circuit will not accurately indicate the appropriate address.

One approach to this current-loading problem is to limit the number of antifuses in each group so that the cumulative current draw of the antifuses will be insufficient to pull down the high voltage. However, reducing the number of antifuses in the groups slows the process of blowing the antifuses, thereby decreasing the efficiency with which the memory circuits can be produced.

SUMMARY OF THE INVENTION

A self-decoupling antifuse address detection circuit according to the invention is formed from two principal portions, an antifuse bank and a correlation circuit. The antifuse bank includes several parallel self-decoupling antifuse circuits, with each antifuse circuit corresponding to a bit of an address to be detected.

Each of the antifuse circuits includes an antifuse that is either blown or unblown, depending upon the respective bit of the address to be detected. The appropriate antifuses are blown by applying a high voltage across the antifuses to produce a conductive path through the antifuses. To improve the efficiency of fuse blowing, the antifuses are blown in groups with a single voltage source driving several antifuses at the same time. Since the antifuses in each group are connected in parallel with each other, they draw an increasing amount of current from the high voltage supply as an increasing number of antifuses are blown. To prevent the current draw of the blown antifuses from loading the high voltage supply, the antifuses are self-decoupling.

The antifuse circuits self-decouple by setting an output latch when the current drawn by each of the blown antifuses is sufficiently high. The set latch activates a decoupling transistor to remove a current path from the antifuse to ground. The only remaining current path from the antifuse is through the latch. Because the latch has a high resistance, very little current can flow through the antifuse. Thus, the blown antifuse does not significantly load the high voltage supply.

In one embodiment of the invention, the high voltage for blowing the antifuses is applied in two steps. The first step raises the voltage to approximately half of its maximum value during an interval when a reset transistor provides a path to ground. Any transients produced by the initial step to the half-maximum are thus channeled to ground to prevent accidental triggering of the latch. After the transients have died, the reset transistor is turned OFF, eliminating the path to ground. Then, the high voltage is raised to its maximum value to begin blowing the fuse. Because the voltage change of the second transition is only half of the maximum value, the resulting transient is reduced in magnitude, reducing the likelihood that the latch will be tripped.

Once all of the antifuses are blown, reset circuits in each of the antifuse circuits reset the latches, thereby recoupling the antifuses. Then, a test voltage can be applied and an address can be detected. The output of the latch provides the antifuse circuit output so that the antifuse circuit produces a low signal if the antifuse is blown and a high signal if the antifuse is unblown.

The outputs from all of the antifuse circuits in the antifuse bank are compared to respective bits of an address in a correlation circuit. If the pattern of antifuses corresponds exactly to the pattern of bits in the address, the correlation circuit produces an output signal indicating that the programmed address has been detected. In response, a redundant row or column of the memory array is substituted for the row or column indicated by the detected address.

DETAILED DESCRIPTION OF THE INVENTION

Figure 1:
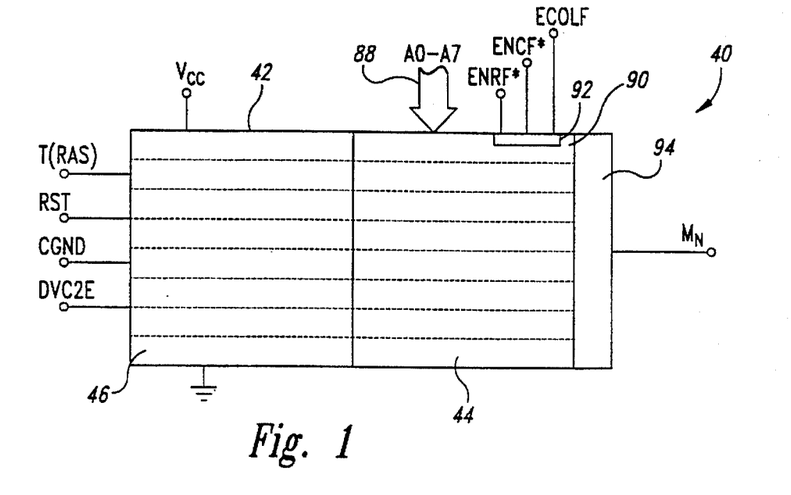
FIG. 1 is a block diagram of an antifuse address detection circuit according to the invention showing a bank of self-decoupling antifuse circuits and a correlation circuit.

As shown in FIG. 1, an antifuse address detection circuit 40 includes two principal portions, an antifuse bank 42 and a correlation circuit 44. The antifuse bank 42 is formed from eight parallel antifuse circuits 46, where each antifuse circuit 46 corresponds to a bit of an address to be detected. The correlation circuit 44 is formed from eight MUX banks 90, an enable bank 92 and a combining circuit 94.

Figure 2:
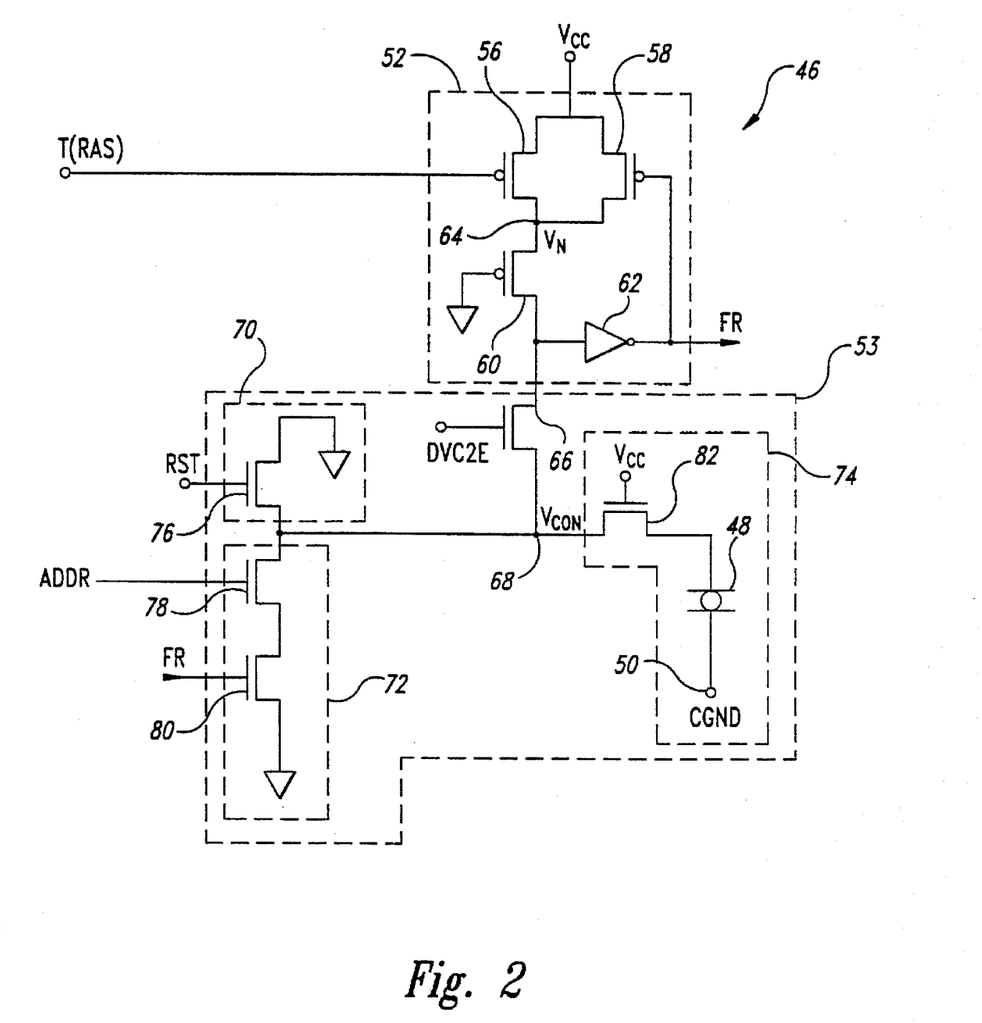
FIG. 2 is a schematic of one of the self-decoupling antifuse circuits of FIG. 1 where the antifuse is represented in an unblown state.

FIG. 2 presents one of the antifuse circuits 46 in greater detail. Each of the antifuse circuits 46 is identical except to the extent of the blown or unblown state of an antifuse 48 in each. Therefore, the following description applies equally to all of the antifuse circuits 46 in the antifuse bank 42.

The antifuse circuit 46 receives three principal input signals, a trigger signal T(RAS), a device enable signal DVC2E, and a reset signal RST. The trigger signal T(RAS) is a delayed version of the row address select signal RAS, which is a common on-chip signal in many memory devices. Like the row address select signal RAS, the trigger signal T(RAS) is a low-true signal. The trigger signal T(RAS) is active (low) during address detection, and is inactive (high) at other times.

The device enable signal DVC2E is a conventional, on-chip signal at approximately half of the supply voltage $V_{CC}$. For purposes of the following description, the device enable signal DVC2E is always high, i.e., at half the supply voltage $V_{CC}$. The reset signal RST is an externally generated signal that resets the antifuse circuit 46 to the appropriate initial conditions. The timing of the reset signal RST will be described in greater detail below.

In addition to the input signals T(RAS), DVC2E and RST, the antifuse circuit 46 also receives a switchable signal CGND at a switchable node 50. During normal operation, the switchable signal CGND is ground to provide a reference for the antifuse 48. For blowing the antifuse 48, the switchable signal CGND is a high voltage, typically greater than 10 volts.

The structure and operation of the antifuse circuit 46 will now be described. The antifuse circuit 46 includes two principal portions, an output latch 52 and a latch control section 53. The latch 52 will be described first.

The latch 52 is formed from three PMOS transistors 56, 58, 60 and an inverter 62. The first and second transistors 56, 58 are coupled in parallel with their sources coupled to the supply voltage $V_{CC}$ and their drains coupled at a node 64. The gate of the first transistor 56 is controlled by the trigger signal T(RAS) and the gate of the second transistor 58 is controlled by the output of the inverter 62, which is also the output signal FR of the antifuse circuit 46. In this configuration, if either the trigger signal T(RAS) or the output of the inverter 62 is low, the node 64 will be coupled to the supply voltage $V_{CC}$ through the first or second transistor 56, 58, respectively. Consequently, the node voltage $V_N$ will be high. The third transistor 60 couples the node 64 to the inverter input. The third transistor's gate is grounded so that the third transistor 60 is always ON. The third transistor 60 has a high channel length-to-width ratio so that it has a high channel resistance of about 300 k$\Omega$. The third transistor 60 thus forms a constant, high resistance path between the node 64 and the input to the inverter 62.

Ignoring for purposes of the present discussion the effect of the latch control section 53, operation of the latch 52 can be seen to be controlled by the trigger signal T(RAS). As will be discussed below, the initial conditions are established with the output signal FR from the latch 52 high. Consequently, the gate of the second transistor 58 will also be high such that the second transistor 58 is OFF. Initially, the trigger signal T(RAS) is also high, so the first transistor 56 is OFF, isolating the node 64 from the supply voltage $V_{CC}$. The node voltage $V_N$ will be low, because the latch control section 53 forms a path for current to bleed to ground, as will be described below. The third transistor 60 couples the node voltage $V_N$ to the inverter 62 so that the input voltage of the inverter 62 is low. The inverter 62 thus continues to supply a high voltage to the gate of the second transistor 58, keeping the second transistor 58 OFF and maintaining the initial conditions.

After the initial conditions are established, the trigger signal T(RAS) goes low, turning ON the first transistor 56. In response, supply voltage $V_{CC}$ pulls the node voltage $V_N$ higher, through the first transistor 56. The third transistor 60 transmits the high node voltage $V_N$ to the input of the inverter 62. In response, the inverter 62 sets the output signal FR low, thereby turning ON the second transistor 58. At this point, both the first and second transistors 58 are ON.

Later (after address detection is complete), the trigger signal T(RAS) returns high, turning OFF the first transistor 56. However, the node voltage $V_N$ remains high, because the second transistor 58 is ON. Consequently, the input voltage to the inverter 62 remains high and the inverter 62 keeps the second transistor 58 ON. The output signal FR thus remains low, even after the trigger signal T(RAS) returns high.

The above description of the latch 52 largely neglects the effect of the latch control section 53 on the operation of the latch 52. As will be seen from the following discussion, the latch control section 53 establishes the initial conditions for the latch 52 and can override the latch's response to the trigger signal T(RAS).

The latch control section 53 is formed from a control transistor 66 and three current legs 70, 72, 74, all joined at a control node 68. During normal operation, the control transistor 66 is turned ON by the device enable signal DVC2E to couple the control node 68 to the input of the inverter 62. The control transistor 66 is an NMOS device having a channel width-to-length ratio selected such that the control transistor 66 can easily overpower the third transistor 60. The inverter's input voltage can therefore be controlled by a control voltage $V_{CON}$ at the control node 68.

The control voltage $V_{CON}$ is controlled by one or more of the three legs 70, 72, 74. The first of these is a reset leg 70 that establishes the initial conditions of the latch 52. The reset leg 70 is formed from an NMOS reset transistor 76 coupled between the control node 68 and ground. The reset signal RST drives the gate of the reset transistor 76, such that when the reset signal RST is high, the reset transistor 76 connects the control node 68 to ground. The reset transistor 76 has a high current carrying capability and a sufficiently high width-to-length ratio that the series combination of the reset transistor 76 and the control transistor 66 can pull the input to the inverter 62 to ground by overpowering the third transistor 60.

When the reset leg 70 pulls the inverter input low, it forces the output signal FR to go high. This turns OFF the second transistor 58. The trigger signal T(RAS) is also high, because the initial conditions are established when address detection is inactive. Therefore, the first transistor 56 is also OFF. With both the first and second transistors 56, 58 OFF, the node voltage $V_N$ is pulled low. The latch 52 is thus forced into the stable state described above with the output signal FR high. Because the latch state is stable, the latch 52 remains set even after the reset signal RST is removed.

Figure 5A:
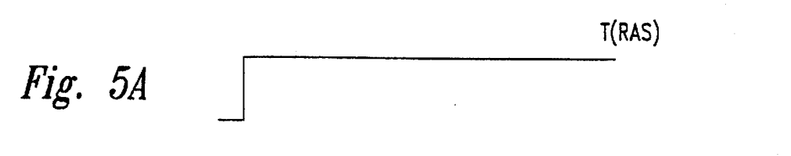
FIGS. 5A–5F are timing diagrams of selected signals within the antifuse circuit of FIG. 4, for blowing the antifuse.
Figure 5B:
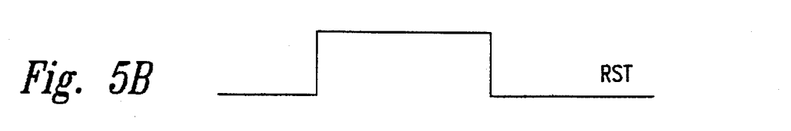
Figure 5C:
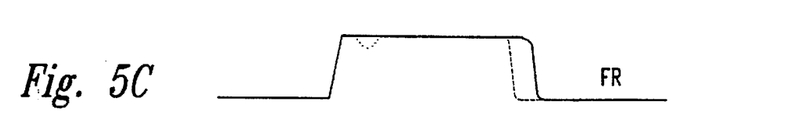
Figure 5D:
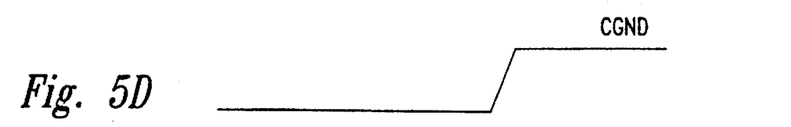

The second of the legs connected to the control node 68 is a reference leg 72 that forms a self-decoupling current path for blowing the antifuse 48. The reference leg 72 includes a pass NMOS transistor 78 and a decoupling NMOS transistor 80, serially coupled between the control node 68 and ground. The pass transistor 78 is controlled by an address signal $A_N$ which represents a bit of an address. The address signal $A_N$ is active when the trigger signal T(RAS) is active as shown in FIG. 5F, such that the pass transistor 78 conducts when the address signal ADDR is high (inactive) and blocks current when the address signal $A_N$ is low (active). If the address signal $A_N$ is low, the pass transistor 78 deactivates the reference leg 72 when the trigger signal T(RAS) activates the latch 52, such that the reference leg 72 does not affect the response of the latch 52 to the trigger signal T(RAS).

The decoupling transistor 80 is directly controlled by the output of the latch 52, such that if the latch output signal FR is low, the decoupling transistor is OFF. The pass transistor 78 and decoupling transistor 80 therefore couple the control node 68 to ground only when the trigger signal T(RAS) is high (inactive) and the latch output signal FR is high. These conditions occur when the antifuse circuit 46 is not being read (trigger signal T(RAS) is inactive) and when the latch 52 indicates an unblown antifuse (the output signal FR is high).

The remaining leg is the antifuse sense leg 74. The sense leg 74 includes an NMOS drop transistor 82 serially connected with the antifuse 48 between the control node 68 and the switchable node 50. The gate of the drop transistor 82 is directly coupled to the supply voltage $V_{CC}$ so that the drop transistor 82 is always ON. The drop transistor 82 therefore acts as a resistive element between the control node 68 and the antifuse 48. Also, the drop transistor 82 limits the maximum voltage applied to the control node 68, to the supply voltage $V_{CC}$ minus the threshold voltage $V_T$ of the drop transistor 82. Consequently, the drop transistor 82 limits the drain-to-gate voltages of the transistors 76, 78 and the source-to-gate voltage of the control transistor 66 to limit breakdown of the gate oxide.

When the antifuse 48 is unblown, as shown in FIG. 2, the antifuse 48 forms an open circuit. Consequently, when the antifuse 48 is unblown, the sense leg 74 does not affect the control voltage $V_{CON}$ and thus does not affect the latch 52.

Figure 3:
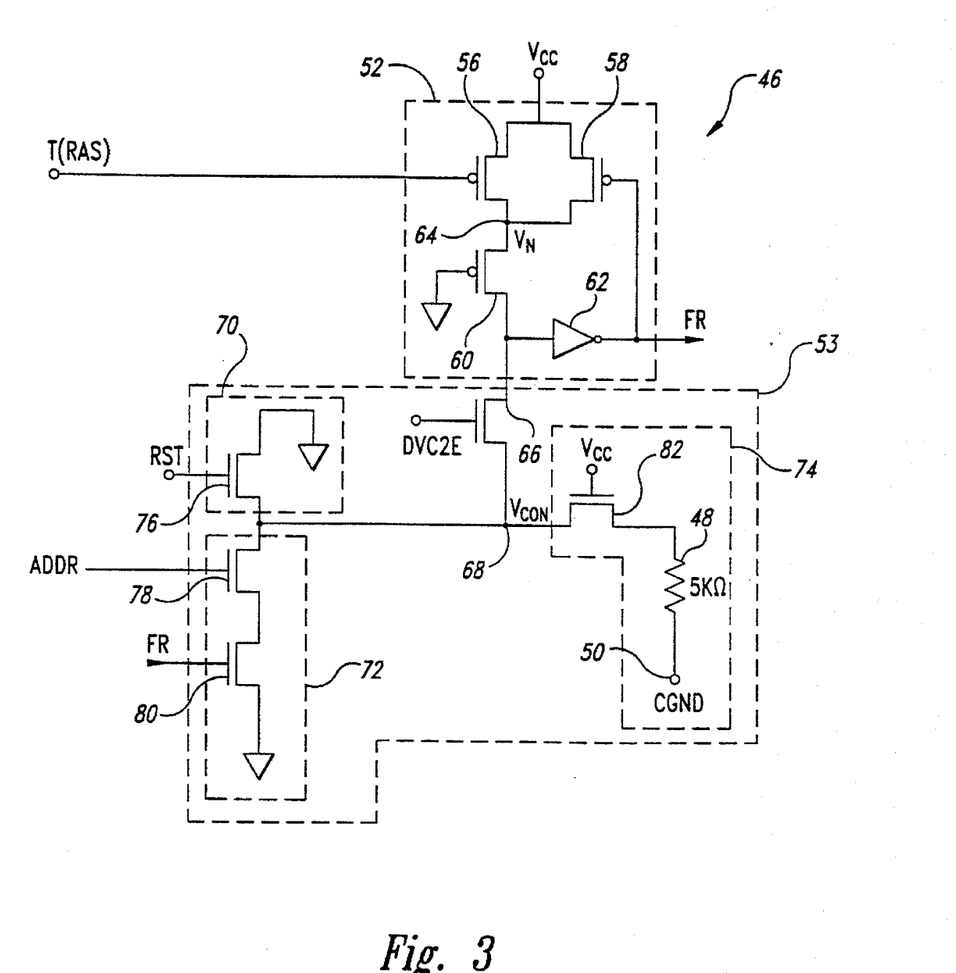
FIG. 3 is a schematic of the self-decoupling antifuse circuit of FIG. 2 where the antifuse is represented as a 5 k$\Omega$ resistor.

When the antifuse 48 is blown, the antifuse 48 impedance is approximately 5 kΩ, as represented by the resistor symbol in FIG. 3. The blown antifuse 48 and drop transistor 82 form a conductive path between the control node 68 and the switchable node 50, allowing the switchable signal CGND to affect the control voltage $V_{CON}$. During detection, the switchable signal CGND is ground, pulling down the control voltage $V_{CON}$. The low control voltage $V_{CON}$ causes the input of the inverter 62 to go low, tripping the latch 52. The output signal FR then goes high, indicating that the antifuse 48 is blown. The output signal FR remains high even when the trigger signal T(RAS) goes high, because the control transistor 66, the drop transistor 82 and the blown antifuse 48 draw sufficient current to overpower the third transistor 60. Thus, when the antifuse 48 is blown, the output signal FR goes high and stays high. The latch 52 thus acts as a detect circuit to detect when the antifuse 48 is blown, because the output of the latch 52 is determined by the blown or unblown state of the antifuse 48, as described above.

The component values can be determined from the above-described operation. During fuse blowing, the trigger signal T(RAS) is low so that the first transistor 56 is ON. The third transistor 60, the control transistor 66, and the drop transistor 82 are also ON as discussed above. The input voltage to the inverter 62 is therefore established by a simple resistor divider where the resistances are the channel resistances of the transistors 56, 58, 60, 66, 82, and the resistance of the antifuse 48. The antifuse resistance at which the response of the antifuse circuit 46 changes from an "unblown antifuse" response to a "blown antifuse" response is determined by the antifuse resistance and the conductances of the transistors 56, 58, 60, 66 and 82. The threshold voltage of the inverter 62 is established at about 1.5V. The lengths and widths of the first transistor 56, second transistor 58, control transistor 66 and the drop transistor 82 are selected such that the input voltage to the inverter 62 will be 1.5V when the antifuse resistance is on the order of 5–6 kΩ. Thus, the output signal FR will be high if the blown antifuse resistance is at or below 5–6 kΩ.

The above description of the antifuse circuit 46 considers only the steady state response. However, the antifuse circuit 46 self-decouples as the antifuse 48 is blown, which is not a steady state transition. The self-decoupling of the antifuse circuit 46 is best described with reference to FIG. 4, where the antifuse 48 is represented as a variable resistor.

Figure 4:
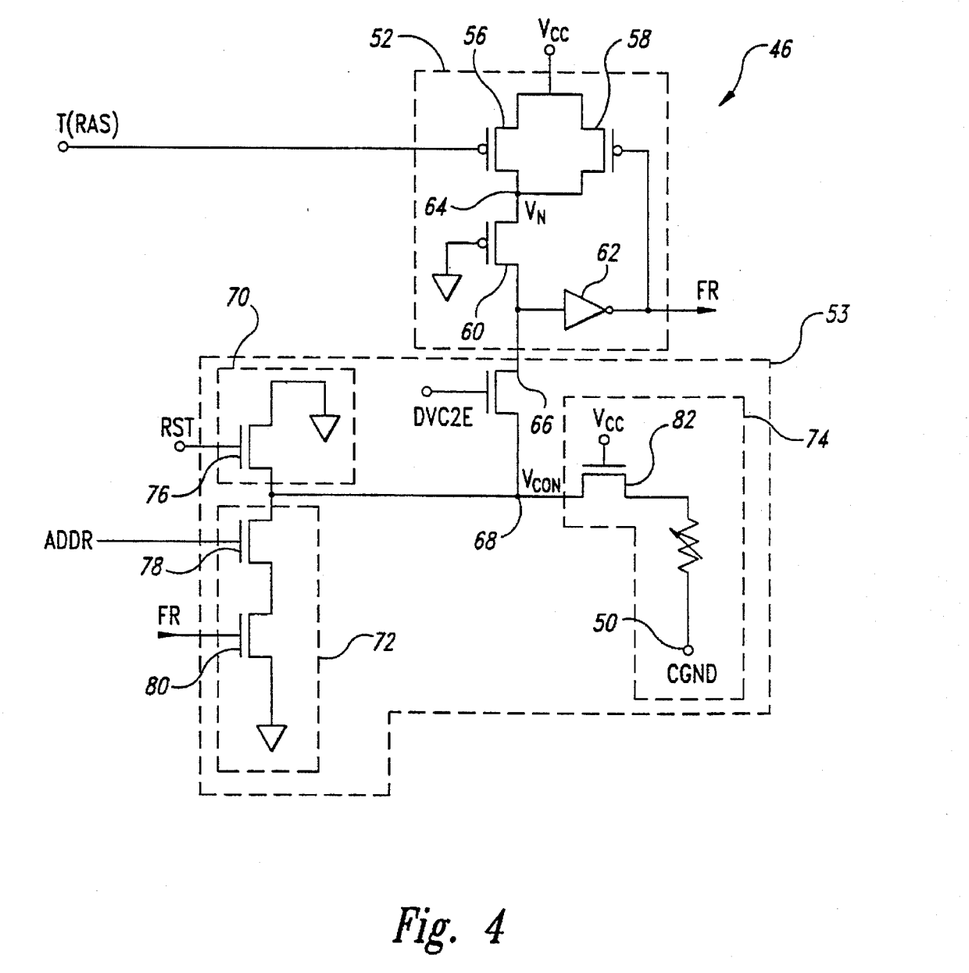
FIG. 4 is a schematic of the self-decoupling antifuse circuit of FIG. 2 where the antifuse is represented as a variable resistor.

Before blowing the antifuse 48, the appropriate programming conditions are established. First, the trigger signal T(RAS) is set high, as shown in FIG. 5A, turning ON the pass transistor 78 and turning off the first transistor 56. Then, the reset signal RST goes high for a brief period, as shown in FIG. 5B. The high reset signal RST turns on the reset transistor 76 to force the control voltage $V_{CON}$ low, thereby forcing the input to the inverter 62 low. This causes the output signal FR to go high (FIG. 5C), turning ON the decoupling transistor 80. The reference leg 72 forms a path from the control node 68 to ground, because the pass and decoupling transistors 78, 80 are both ON.

After a period of time sufficient to set the latch 52, the reset signal RST returns low, turning OFF the reset transistor 76. The control node 68 remains coupled to ground through the pass transistor 78 and the decoupling transistor 80. After the reset signal RST goes low, the switchable signal CGND of 12V is applied to the switchable node 50 to blow the antifuse 48. As the antifuse 48 blows, its resistance drops, allowing current to flow past the control node 68 and through the reference leg 72. Very little of this current flows through control transistor 66, because of the high resistance of the third transistor 60.

As the resistance of the antifuse 48 drops and current through the reference leg 72 increases, the control voltage $V_{CON}$ increases. The input voltage to the inverter 62 increases correspondingly, until the inverter's threshold voltage of 1.5V is reached. When the input voltage to the inverter 62 is above 1.5V, i.e., the current through the antifuse 48 reaches a selected level, the inverter 62 outputs a low latch output signal FR low, turning OFF the decoupling transistor 80. The current path through the reference leg 72 is thereby removed and the voltage of the node 68 quickly goes high. With the reference leg 72 turned OFF, the only path for current from the switchable node 50 is through the control transistor 66 and the third transistor 60. As noted above, the third transistor 60 has a channel resistance of about 300 kΩ, so the latch 52 will draw very little current. The total current draw of the antifuse circuit 46 will thus be very low after the latch 52 is tripped. The tripping of the latch 52 thus effectively decouples the antifuse circuit 46 from switchable signal CGND to reduce loading of the high voltage source. As explained above, the low output signal FR from the inverter 62 also turns on the second transistor 58 thereby raising $V_N$ to the supply voltage $V_{CC}$ and maintaining FR low.

One concern in the antifuse circuit 46 is its response to transient signals. In particular, before the antifuse 48 is blown, the antifuse 48 operates as a capacitor. If the 12V switchable signal CGND is applied to the antifuse 48 as a step voltage as shown in FIG. 5D, the capacitive antifuse 48 can transmit a transient signal to the control node 68. If the transient signal is sufficiently high, the input to the inverter 62 will go high enough to trip the latch 52. This causes the latch output signal FR to go low prematurely, as indicated by the broken line in FIG. 5C. The low output signal FR turns OFF the decoupling transistor 80 and eliminates the reference leg 72 as a path for current flow. The antifuse 48 is then very difficult to blow, because no low resistance path remains from the antifuse 48 to ground.

Figure 5E:
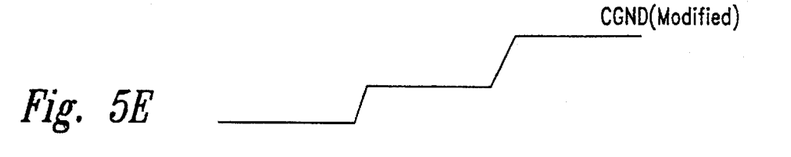
Figure 5F:
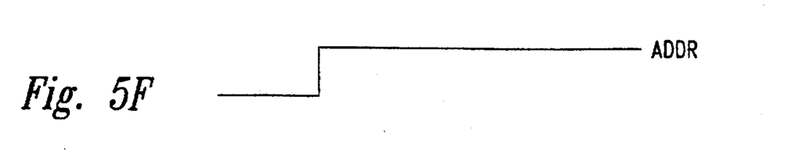

To reduce the possibility of a transient signal tripping the latch 52, the switchable signal CGND is initially raised to approximately 6V while the reset signal RST is still high, as shown in FIG. 5E. This allows the reset transistor 76 to sink current from the control node 68 to minimize the effect of any transient signal caused by the 6V step. The initial rise of the switchable signal CGND is limited to 6V so that the maximum voltage across the antifuse 48 is limited to 6V while the reset transistor 76 is ON. This prevents the antifuse 48 from blowing when the reset transistor 76 is ON. If the switchable signal CGND were raised to the full 12V while the reset transistor 76 was ON, the antifuse 48 could blow and pour an unacceptably large current through the reset transistor 76.

After the switchable signal voltage CGND has been raised to 6V and a sufficient time lapse has occurred to allow transient signals to fade, as indicated by the dotted line in FIG. 5C, the reset signal RST returns low and the switchable signal CGND is raised to the full 12V. Because the incremental change in voltage across the antifuse 48 is only 6V, the amplitude of the transient signal at the control node 68 is reduced, such that the latch 52 is less likely to be tripped.

Returning to FIG. 1, the embodiment of FIGS. 2, 3, and 4 forms one of the eight antifuse circuits 46 in the antifuse bank 42. The output signals FR from the respective antifuse circuits 46 will be designated $FR_N$ where the subscript N indicates the number of the corresponding antifuse circuit 46. The output signals $FR_N$ from the antifuse circuits 46 are compared in the correlation circuit 44 to respective address bits from an address bus 88. If the pattern of address bits on the address bus 88 corresponds exactly to the output signals $FR_N$, the correlation circuit 44 produces a match signal $M_N$ indicating the address has been matched.

Figure 6:
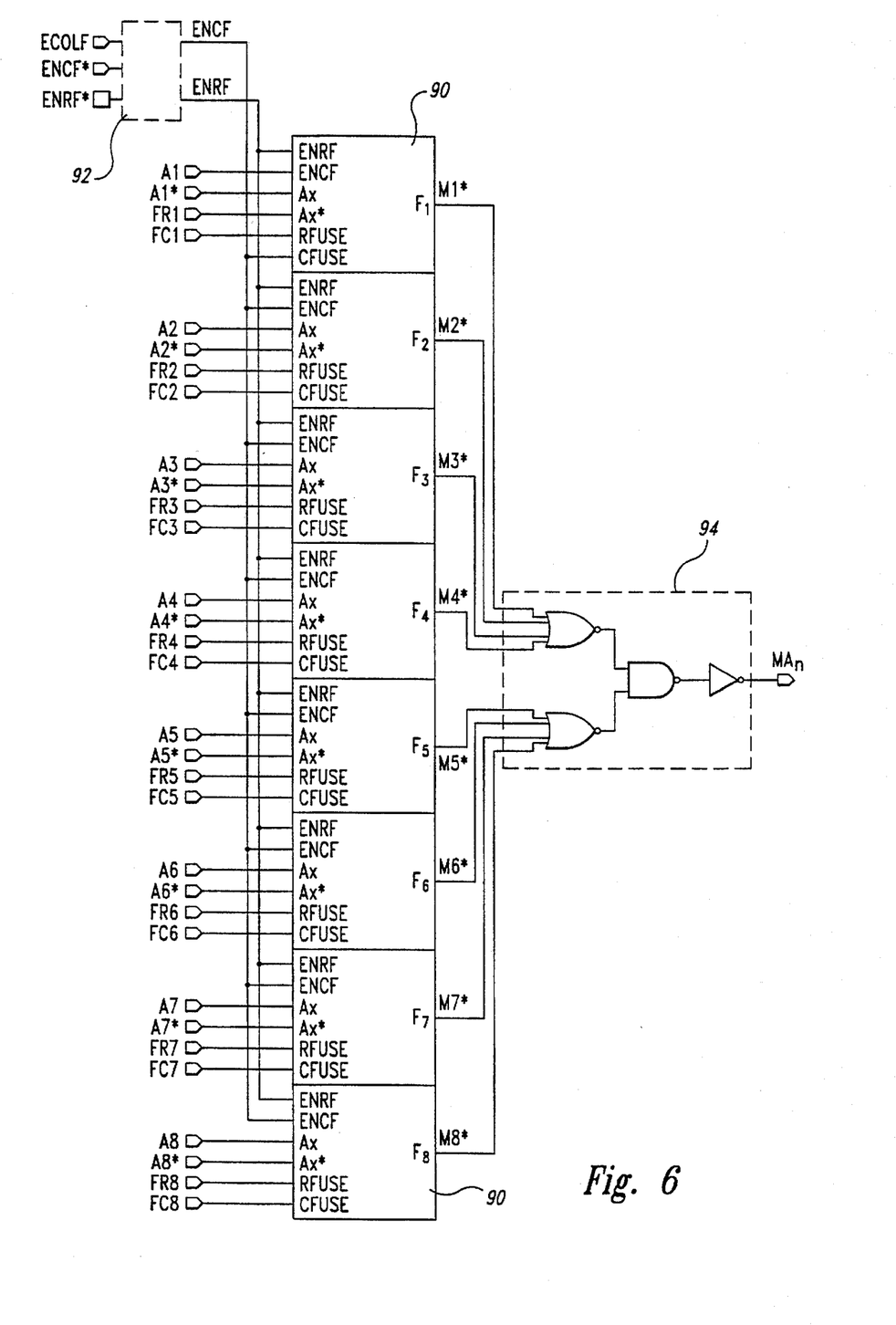
FIG. 6 is a block diagram of the address correlation circuit of the address detection circuit of FIG. 1.

FIG. 6 shows an exemplary embodiment of the correlation circuit 44 in greater detail. The correlation circuit 44 includes eight MUX banks 90, each corresponding to one bit of a bit address. All of the MUX banks 90 receive common enable signals ENRF, ENCF indicating that either a row or a column is enabled. The enable signals ENRF, ENCF are generated by an enable bank 92 in response to externally generated complementary enable column and enable row signals ENCF*, ENRF* and an enable column function signal ECOLF. The enable bank alternately enables the enable column and enable row signals ENCF, ENRF, such that only one of the signals ENRF, ENCF is active at any one time.

In addition to the enable signals ENRF, ENCF, each MUX bank 90 receives complementary address signals $A_N$, $A_N$* from the address bus 88 and the output signals $FR_N$ from the respective antifuse circuits 46. Because the MUX banks 90 are used for both row and column address detection, the MUX banks 90 also receive output signals $FC_N$ from column address detection circuits substantially identical to the address detection circuit 46 of FIGS. 2–4.

In response to the enable signals ENCF, ENRF, each of the MUX banks 90 compares the output signal $FR_N$ or $FC_N$ to the respective address signal $A_N$ and outputs a complementary bit match signal $M_N$*. The complementary bit match signal $M_N$* is low if the respective bit of the address signal $A_N$ matches the output signal $FR_N$ or $FC_N$ and is high if the respective bit does not match the output signal $FR_N$ or $FC_N$.

The outputs of the MUX banks 90 are then combined in the combining circuit 94 to produce an address match signal $MA_N$ if the pattern address bits correspond exactly to the blown antifuses 48. The address match signal $MA_N$ indicates the pattern of address bits matches the pattern of blown fuses and causes the substitution of a redundant row or column for the addressed row or column.

Figure 7:
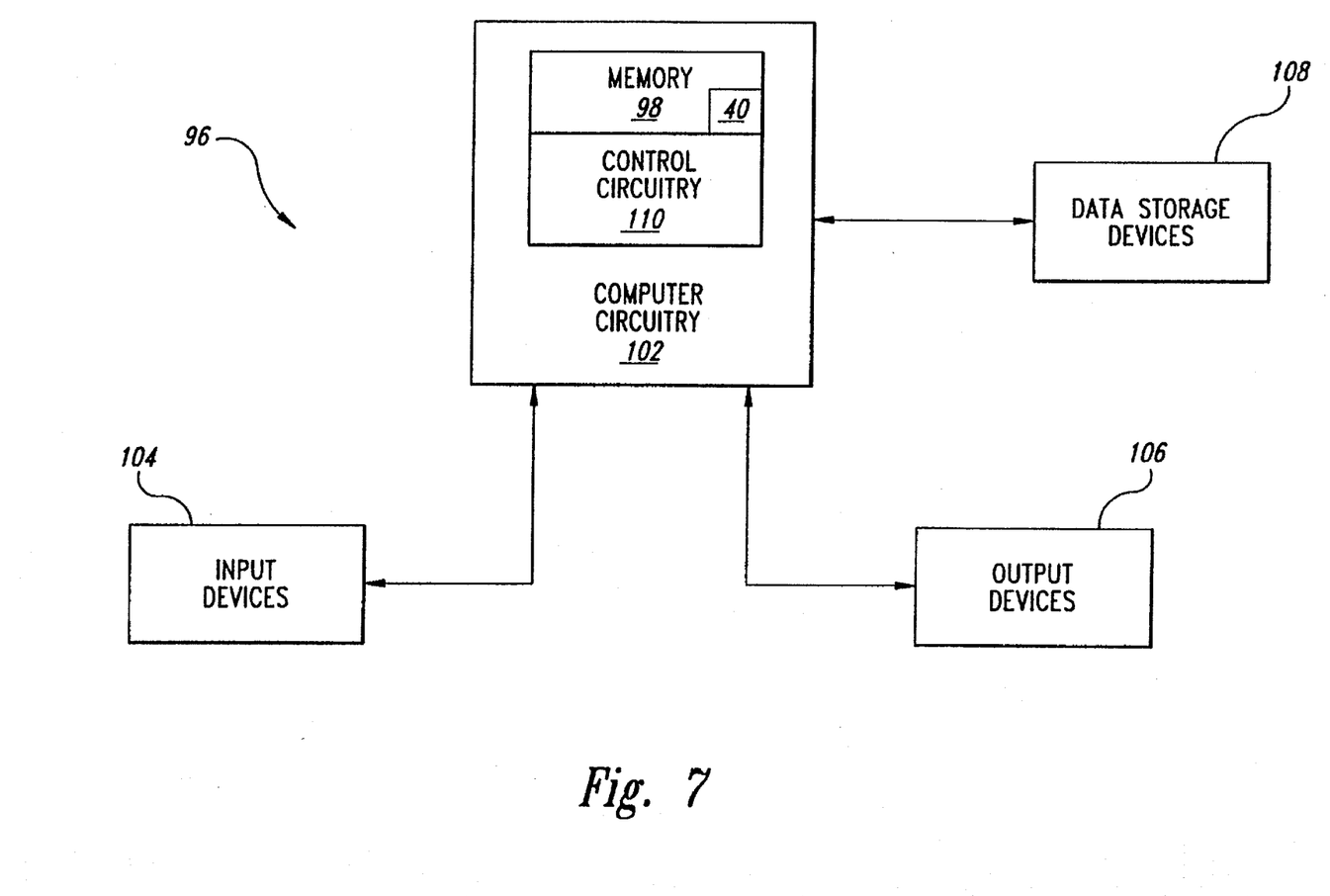
FIG. 7 is a block diagram of a computer system containing a dynamic random access memory using an antifuse address detection circuit according to the present invention.

FIG. 7 is a block diagram of a computer system 96 employing a memory device 98 that contains the address detection circuit 40 of FIG. 1. The computer system 96 includes computer circuitry 102 for performing computer functions, such as executing software to perform desired calculations and tasks. The circuitry 102 typically contains a processor (not shown) and the memory 98 as shown.

One or more input devices 104, such as a keypad or a mouse, are coupled to the computer circuitry 102 and allow an operator to manually input data thereto. One or more output devices 106 are coupled to the computer circuitry 102 to display or otherwise output data generated by the computer circuitry 102. Examples of output devices include a printer and a video display unit. One or more data storage devices 108 are coupled to the computer circuitry to store data on or retrieve data from external storage media (not shown). Examples of storage devices 108 and storage media include drives that accept hard and floppy disks, tape cassettes, and compact-disk read only memories. The computer circuitry 102 also includes the address bus 88 of FIGS. 1 and 6 and control circuitry 110 that produces the signals described above for input to the address detection circuit 40 of FIG. 1.

While a specific embodiment of the invention has been described herein for purposes of illustration, various modifications may be made without deviating from the spirit and scope of the invention. Accordingly, the invention is not limited except as by the appended claims.

We claim:

1. An integrated antifuse driving circuit for blowing a plurality of antifuses coupled to a node, comprising:
    a voltage source for providing a driving voltage to the antifuses to blow the antifuses;
    a plurality of blown antifuse detect circuits each coupled to detect the blown or unblown state of a respective antifuse; and
    a plurality of decoupling circuits each coupled to respond to a respective one of the blown antifuse detect circuits to decouple detected blown antifuses, thereby limiting current flow through the blown antifuses.

2. The antifuse driving circuit of claim 1 wherein each of the decoupling circuits is operable to recouple the blown antifuses.

3. The antifuse driving circuit of claim 1 wherein each blown antifuse detect circuit includes a signal detector coupled to detect when current through a respective one of the antifuses exceeds a selected level.

4. The antifuse driving circuit of claim 1 wherein the decoupling circuit includes an externally controlled pass transistor, the pass transistor limiting current flow through the decoupling circuit in response to the externally supplied signal.

5. A self-decoupling address detection circuit, comprising:
    an antifuse operative to blow in response to a fuse blowing voltage applied across the antifuse;
    a blown antifuse detect circuit coupled to detect when the antifuse is blown, the blown antifuse detect circuit producing a blown antifuse signal in response to detection of the blowing of the antifuse; and
    a decoupling circuit connected to limit current flow through the antifuse in response to the blown antifuse signal.

6. The address detection circuit of claim 5 wherein the blown fuse detection circuit is a latch coupled to detect the blown or unblown state of the antifuse in response to a trigger voltage applied to the latch.

7. The address detection circuit of claim 6 wherein the decoupling circuit further includes a pass circuit coupled to block current flow through the decoupling circuit in response to the trigger voltage.

8. The address detection circuit of claim 7, further including a reset circuit coupled to reset the latch in response to a reset signal.

9. A computer system comprising:
    a data input device;
    a data output device;
    an address bus; and
    computing circuitry coupled to the data input and output devices and the address bus, the computing circuitry including a memory device including an integrated antifuse driving circuit for blowing a plurality of antifuses coupled to a node, the driving circuit including:
    a voltage source for providing a driving voltage to the antifuses to blow the antifuses;
    a plurality of blown antifuse detect circuits each coupled to detect the blown or unblown state of a respective antifuse; and
    a plurality of decoupling circuits each coupled to respond to a respective one of the blown antifuse detect circuits to decouple detected blown antifuses, thereby limiting current flow through the blown antifuses.

10. The computer system of claim 9 wherein each of the decoupling circuits is operable to recouple the blown antifuses.

11. The computer system of claim 9 wherein the blown antifuse detect circuit includes a signal detector coupled to detect when current through a respective one of the antifuses exceeds a selected level.

12. The computer system of claim 9 wherein the decoupling circuit includes an externally controlled pass transistor, the pass transistor limiting current flow through the decoupling circuit in response to the externally supplied signal.

13. A method of programming selected fuses in an antifuse bank according to an address, comprising the steps of:
    applying a fuse blowing voltage to the selected antifuses;
    monitoring each selected antifuse with a respective monitoring circuit while the fuse blowing voltage is applied to the select antifuse, to determine a blown or unblown state of the select antifuse;
    upon identifying a blown state of each selected antifuse, limiting current flow through the blown antifuse until all of the selected antifuses are blown; and
    after blowing all of the selected antifuses, no longer limiting current flow through the blown antifuses.

14. The method of claim 13 wherein the antifuse bank includes a plurality of latches, each latch corresponding to a respective one of the antifuses and wherein the step of monitoring each antifuse with a respective monitoring circuit comprises setting the respective latch to produce an output signal of a first state.

15. The method of claim 14 wherein the step of limiting current flow through the antifuse comprises the step of feeding back the output signal to a decoupling circuit to cause the decoupling circuit to limit current flow through the antifuse.

16. A method of blowing a plurality of selected antifuses with a common driving voltage, comprising the steps of:
    coupling the selected antifuses to the common driving voltage;
    monitoring the states of the selected antifuses to identify antifuses that are blown by the common driving voltage; and
    for each antifuse identified as a blown antifuse, decoupling the blown antifuse from the common driving voltage while continuing to provide the common driving voltage to the unblown selected antifuses, until all of the selected antifuses are blown.

17. The method of claim 16 wherein all of the antifuses are coupled to the common driving voltage through a common node, further comprising the step of after all of the selected antifuses are blown, disconnecting the common driving voltage from the common node.

18. The method of claim 16 wherein the step of monitoring the states of the selected antifuses to identify antifuses that are blown by the common driving voltage, comprises the steps of:

monitoring respective impedances of the antifuses; and when the impedance of an antifuse falls below a predetermined level, identifying the antifuse as an antifuse that is blown.

* * * * *